United States Patent
Lazaro et al.

(10) Patent No.: US 10,355,609 B2
(45) Date of Patent: Jul. 16, 2019

(54) VOLTAGE STEP-DOWN TECHNIQUE FOR DERIVING GATE-CHARGE USING MULTI-LEVEL CORE ARCHITECTURE

(71) Applicant: Texas Instruments Incorporated, Dallas, TX (US)

(72) Inventors: Orlando Lazaro, Dallas, TX (US); Kevin Scoones, San Jose, CA (US); Jeffrey Anthony Morroni, Parker, TX (US); Alvaro Aguilar, Irving, TX (US); Reza Sharifi, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/858,648

(22) Filed: Dec. 29, 2017

(65) Prior Publication Data
US 2019/0058405 A1 Feb. 21, 2019

Related U.S. Application Data

(60) Provisional application No. 62/545,660, filed on Aug. 15, 2017.

(51) Int. Cl.
| | |
|---|---|
| *H02M 3/158* | (2006.01) |
| *H02M 3/335* | (2006.01) |
| *H02M 3/06* | (2006.01) |
| *H03K 7/08* | (2006.01) |
| *G05F 1/575* | (2006.01) |
| *H02M 1/00* | (2006.01) |

(52) U.S. Cl.
CPC ........ *H02M 3/33569* (2013.01); *G05F 1/575* (2013.01); *H02M 3/06* (2013.01); *H03K 7/08* (2013.01); *H02M 2001/0003* (2013.01)

(58) Field of Classification Search
CPC ............... H02M 3/33569; H02M 3/06; H02M 2001/0003; H02M 7/483; G05F 1/575; H03K 7/08
See application file for complete search history.

(56) References Cited

U.S. PATENT DOCUMENTS

| | | | |
|---|---|---|---|
| 5,892,450 A | 4/1999 | Scoones | |
| 9,083,230 B2 | 7/2015 | Narimani et al. | |
| 9,160,232 B2 * | 10/2015 | Thomas | ................ H02M 7/483 |
| 9,325,252 B2 | 4/2016 | Narimani et al. | |

(Continued)

OTHER PUBLICATIONS

International Search Report for PCT/US2018/000233 dated Dec. 20, 2018.

*Primary Examiner* — Adolf D Berhane
*Assistant Examiner* — Jye-June Lee
(74) *Attorney, Agent, or Firm* — Michael A. Davis, Jr.; Charles A. Brill; Frank D. Cimino

(57) ABSTRACT

In described examples of methods and control circuitry to control a multi-level power conversion system with a flying capacitor, a power circuit regulates a regulator input voltage signal to provide a supply voltage signal to the control circuitry. A power switching circuit couples the regulator input to a first terminal of the flying capacitor in response to a second terminal of the flying capacitor being coupled to a reference voltage node in a given switching cycle, and couples the regulator input to the second terminal in response to the first terminal being coupled to an input node of the power conversion system in the given switching cycle.

16 Claims, 6 Drawing Sheets

(56) References Cited

U.S. PATENT DOCUMENTS

| | | |
|---|---|---|
| 9,520,800 B2 | 12/2016 | Tian et al. |
| 9,559,541 B2 | 1/2017 | Cheng et al. |
| 9,748,862 B2 | 8/2017 | Cheng et al. |
| 9,866,113 B1 | 1/2018 | Assaad |
| 9,929,653 B1 * | 3/2018 | Mercer ................. H02M 3/158 |
| 10,050,515 B1 * | 8/2018 | Chakraborty ........... H02M 1/32 |
| 2010/0253313 A1 | 10/2010 | Herzer |
| 2010/0308784 A1 | 12/2010 | Scoones et al. |
| 2011/0018511 A1 | 1/2011 | Carpenter |
| 2011/0199057 A1 | 8/2011 | Ivanov et al. |
| 2011/0235831 A1 | 9/2011 | Kaiho |
| 2011/0316503 A1 | 12/2011 | Huang |
| 2012/0098512 A1 | 4/2012 | Kirchner |
| 2013/0334987 A1 | 12/2013 | Garg |
| 2015/0207401 A1 | 7/2015 | Zhang |
| 2015/0340952 A1 | 11/2015 | Manohar |
| 2016/0118886 A1 * | 4/2016 | Zhang ................... H02M 3/158 |
| | | 323/271 |
| 2016/0254745 A1 | 9/2016 | Lim et al. |
| 2016/0254746 A1 * | 9/2016 | Lerdworatawee .... H02M 3/158 |
| | | 323/271 |
| 2016/0299554 A1 | 10/2016 | Kumar |
| 2016/0301303 A1 | 10/2016 | Bari |
| 2016/0315539 A1 * | 10/2016 | Lee ....................... H02M 3/158 |
| 2016/0373002 A1 | 12/2016 | Borfigat |
| 2017/0126120 A1 | 5/2017 | Chakraborty et al. |
| 2017/0149335 A1 | 5/2017 | Morroni |
| 2017/0256950 A1 * | 9/2017 | Kuai ..................... H02M 7/483 |
| 2018/0006559 A1 * | 1/2018 | Chen ....................... H02M 1/08 |

* cited by examiner

VOLTAGE STEP-DOWN TECHNIQUE FOR DERIVING GATE-CHARGE USING MULTI-LEVEL CORE ARCHITECTURE

CROSS-REFERENCE TO RELATED APPLICATIONS

This application claims priority to, and the benefit of, U.S. Provisional Patent Application No. 62/545,660, entitled "Voltage Step-Down Technique for Deriving Gate-Charge for Improved Efficiency Utilizing Multi-Level Core Architecture," filed Aug. 15, 2017, the entirety of which is hereby incorporated by reference. This application is related to co-pending and co-assigned patent application Ser. No. 15/858,626, entitled "HARMONIC MODULATION FOR CHARGE BALANCE OF MULTI-LEVEL POWER CONVERTERS", filed on Dec. 29, 2017, the entirety of which is hereby incorporated by reference. This application is related to co-pending and co-assigned patent application Ser. No. 15/858,640, entitled "HYSTERETIC PULSE MODULATION FOR CHARGE BALANCE OF MULTI-LEVEL POWER CONVERTERS", filed on Dec. 29, 2017, the entirety of which is hereby incorporated by reference.

BACKGROUND

High efficiency power supplies are desirable for battery-operated systems, including mobile phones, tablets, laptops and other user devices. Buck, boost and other two-level DC to DC converters use high and low side drivers to alternately connect a switching node to the input voltage or ground. As a result, the high and low side drivers are sized to withstand the input voltage level, and suffer from high switching losses. Three-level and higher order switching converter circuits use more switching transistors and one or more flying capacitors, resulting in higher effective switching frequency and reduced switching loss. These higher level converters can provide higher power density with reduced voltage withstanding requirements of the converter switches. Driver circuitry delivers pulse width modulated gate signals to control the converter switches. Gate charge and quiescent current for controlling the converter switches is commonly derived from the input voltage signal. This incurs additional loss associated with step down using a linear regulator. A linear regulator also uses an additional output capacitor and thus adds additional passive elements.

SUMMARY

In described examples of methods and control circuitry to control a multi-level power conversion system with a flying capacitor, a power circuit regulates a regulator input voltage signal to provide a supply voltage signal to the control circuitry. A power switching circuit couples the regulator input to a first terminal of the flying capacitor in response to a second terminal of the flying capacitor being coupled to a reference voltage node in a given switching cycle, and couples the regulator input to the second terminal in response to the first terminal being coupled to an input node of the power conversion system in the given switching cycle.

DETAILED DESCRIPTION

Figure 1:
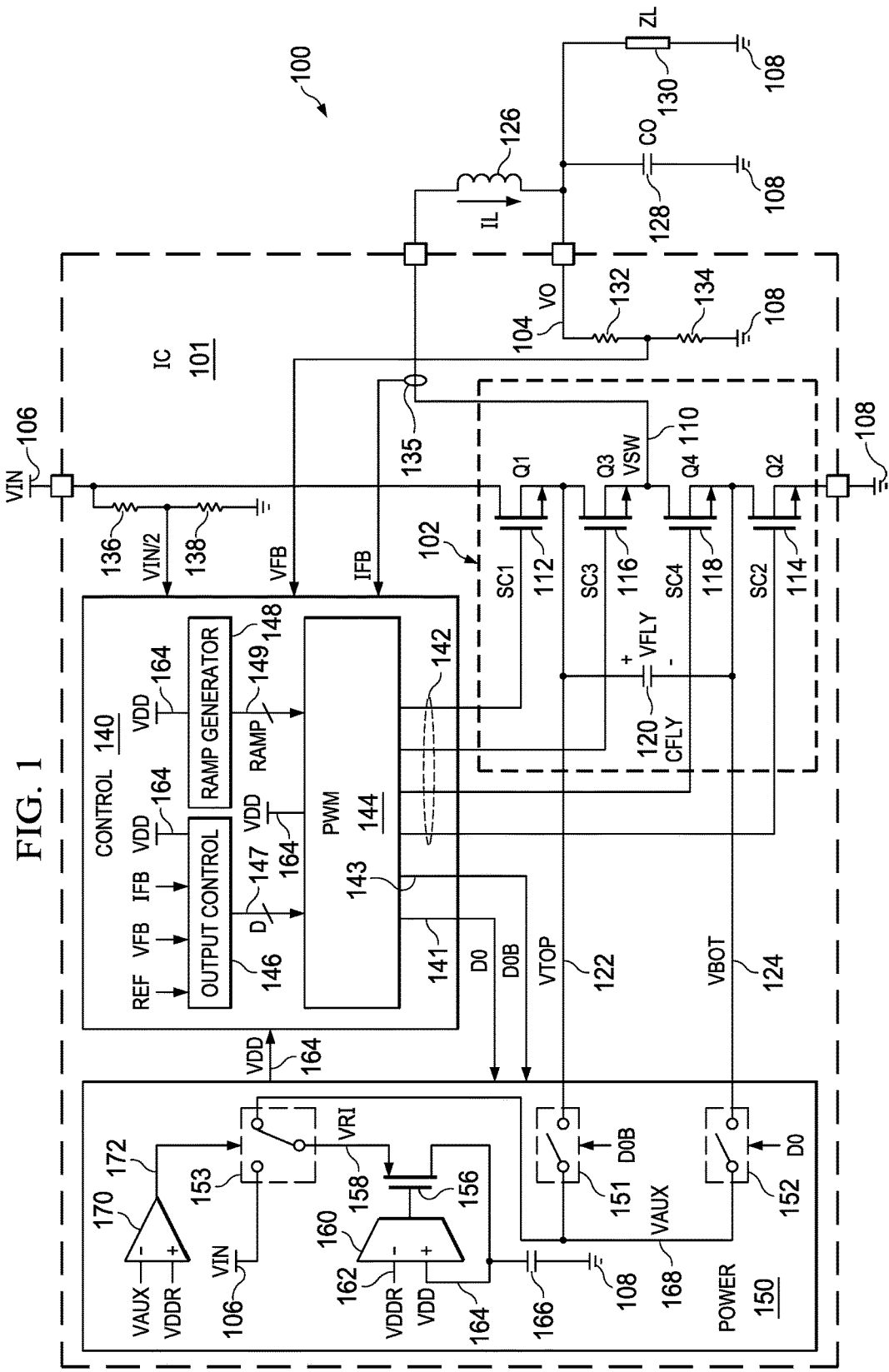
FIG. 1 is a system diagram of a multi-level power conversion system with a power circuit to provide a supply voltage signal to control circuitry.

In the drawings, like reference numerals refer to like elements throughout, and the various features are not necessarily drawn to scale. In this description, the term "couple" or "couples" or "coupled" includes indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a multi-level power conversion system 100, which in one example includes an integrated circuit (IC) 101 with a converter circuit 102. The IC 101 includes an output node 104 (e.g., IC pin or pad) to deliver an output signal, such as an output voltage signal VO to drive a connected load. The example IC 101 includes an input node 106 (e.g., IC pin or pad) to receive an input signal, such as an input voltage signal VIN. In the illustrated example, the conversion system 100 is a DC-DC converter. When powered, the system 100 converts an input signal VIN at an input node 106 to provide an output signal, such as a voltage output signal VO, to an output node 104. In one example, the converter circuit 102 operates to regulate the output voltage VO according to a reference signal or value REF, which can be an internal reference or can be provided to an output control circuit in the IC 101. The converter circuit 102 includes a switching circuit with transistor switches connected between the input node 106 and a reference voltage node 108 (e.g., a ground reference). The switching circuit is connected to provide a switching node signal to a switching node 110, such as a switching node voltage signal VSW.

The converter circuit 102 in FIG. 1 is a three-level converter that includes switches 112 (labeled Q1), 114 (labeled Q2), 116 (labeled Q3) and 118 (labeled Q4) coupled in a series circuit between the input node 106 and the reference voltage node 108. The switches 112, 114, 116 and 118 operate according to switching control signals SC1, SC2, SC3 and SC4, respectively, to provide a voltage signal VSW to the switching node 110. In other examples, the converter circuit 102 can include more or fewer switches to provide an N-level converter, where N is greater than 2. In the illustrated example, the converter circuit switches 112, 114, 116 and 118 are n-channel MOSFET (e.g., NMOS) transistors operative to turn on according to a corresponding active high switching control signal. In other examples, different transistor switches can be used (e.g., PMOS, bipolar, IGBTs). The first switch 112 in FIG. 1 includes a drain connected to the input node 106 and a source connected to the first internal node 122. The third switch 116 includes a drain connected to the internal node 122, and a source connected to the switching node 110. The fourth transistor 118 includes a drain connected to the switching node 110, and a source connected to the second internal node 124. The second transistor 114 includes a drain connected to the second internal node 124, and a source connected to the reference voltage node 108. The multi-level converter circuit 102 also includes a capacitor 120, referred to herein as a flying capacitor (labeled CFLY). The capacitor 120 is connected between a first internal node 122 and a second internal node 124 of the switching circuit. In one example, the IC 101 includes the flying capacitor 120 as shown in FIG. 1. In another example, the IC 101 includes pins or pads (not shown) to allow connection of an external flying capacitor 120.

The power conversion circuit 100 also includes an inductor 126 coupled between the switching node 110 and the output node 104. In the illustrated example, the IC 101 includes externally accessible pins or pads for connection to the terminals of the inductor 126, including a pin connected to the switching node 110, and a pin or pad connected to the output node 104. In other examples, the inductor 126 can be included in the integrated circuit 101. The configuration of the switching circuit and the inductor 126 provides a buck-type DC-DC converter to provide a controlled output voltage signal VO at the output node 104 by converting input power from the input voltage signal VIN. In the illustrated system 100, an output capacitor 128 (labeled CO) is connected between the output node 104 and the reference voltage node 108, and the output signal VO drives a load 130, (labeled ZL).

The system 100 provides closed loop regulation of the output signal VO according to a feedback signal VFB from a resistive voltage divider circuit formed by divider resistors 132 and 134. The resistors 132 and 134 are connected in series with one another between the output node 104 and the reference voltage node 108, and the feedback signal VFB is created at a center node joining the resistors 132 and 134. In other possible implementations, the voltage feedback signal can be taken directly from the output node 104 (VO), and the control set point or reference (REF in FIG. 1) is scaled accordingly. In some examples, the IC 101 includes a current sensor 135 that senses an inductor current IL flowing in the inductor 126, and provides a current sense feedback signal IFB. In one example, the IC 101 also includes a second resistive voltage divider circuit including resistors 136 and 138 of generally equal resistances to provide a signal VIN/2 representing half of the input voltage signal VIN.

The IC 101 also includes control circuitry 140, which is configured to provide the switching control signals SC1, SC2, SC3 and SC4 to operate the switches 112, 114, 116 and 118. In one example, the control circuitry 140 is implemented as analog circuits configured to implement the functions described herein. In another example, the control circuitry 140 includes one or more digital processing circuits, and converter circuits (not shown) to convert analog signals to digital signals and vice versa. In certain implementations, internal circuits schematically represented in the control circuitry 140 in FIG. 1 can be implemented, in whole or in part, as firmware or software-executed program instructions.

In one example, the control circuitry 140 includes four outputs collectively labeled 142 in FIG. 1 to provide the switching control signals to the switching circuit 102. In this example, the control circuitry 140 includes a pulse width modulation (PWM) circuit 144 that is configured to generate the switching control signals SC1, SC2, SC3 and SC4 with a controlled duty cycle to operate the switches 112, 114, 116 and 118 according to (e.g., in response to, or based upon) a duty cycle signal to control the switching node voltage signal VSW at the switching node 110. The controlled duty cycle is adjustable in different switching cycles. The control circuitry 140 in FIG. 1 also includes an output control circuit 146 configured to control the duty cycle of the switching control signals SC1, SC2, SC3 and SC4 that are generated by the PWM circuit 144. In the illustrated example, the output control circuit 146 includes an output 147 coupled to provide the duty cycle signal D to the PWM circuit 144 to control the duty cycle of the switching control signals SC1, SC2, SC3 and SC4. The duty cycle represents a ratio or proportion of time in a given switching cycle during which certain converter switches 112, 114, 116 and/or 118 are turned on. In one example, the output control circuit 146 is an analog circuit, including comparators, signal amplifiers and other circuitry to generate an error signal based on the difference between the voltage feedback signal VFB and the reference (e.g., setpoint) signal REF. In certain examples, the output control circuit 146 also generates the duty cycle signal D at least partially according to (e.g., at least partially in response to, or at least partially based upon) the inductor current feedback signal IFB.

The PWM circuit 144 in one example is an analog circuit with one or more comparators to selectively change the states of the switching control signals SC1, SC2, SC3 and SC4 between first and second states or values (e.g., high and low) in order to selectively turn the corresponding switches 112, 114, 116 and/or 118 on or off in a controlled fashion. In one example, the duty cycle signal D is a value determined by an outer loop control function that represents the on-time of one or more of the switching control signals in a given switching cycle. In one example, the control circuitry 104 can generate a modulation signal as an analog signal having a voltage level corresponding to a duty cycle determined by the output control circuit 146 according to a closed-loop regulation or control function. For example, the output control circuit 146 implements a proportional-integral (PI) or proportional-integral-derivative (PID) closed loop control function to regulate the output signal VO according to the reference signal REF and one or more feedback signals (e.g., VFB, IFB).

The comparators of the PWM circuit 144 compare a modulation voltage signal that corresponds to the duty cycle signal D with a ramp signal RAMP from a ramp generator circuit 148. Any suitable ramp generator circuitry can be used, such as an RC network with a current source, a capacitor and a resistor (not shown), or an inductor current can be used. In further examples, the ramp generator circuitry 148 can be implemented by processor-executed program instructions in a digital domain. In one implementation, the PWM circuit comparators selectively change the states of one or more of the switching control signals SC1, SC2, SC3 and SC4 at the outputs 142 according to (e.g., in response to or based upon) an upward ramp signal RAMP transitioning above the modulation signal that is derived from the output 147 of the output control circuit 146. In other implementations, one or more functions of the ramp generator circuit 148, the output control circuit 146 and/or the PWM circuit 144 can be implemented by a digital circuit, such as a microprocessor, programmable logic circuit, etc. For example, a digital logic circuit can generate a ramp value, and compare this to a modulation value derived from a closed loop control function implemented as processor-executed program instructions, and generate PWM signals that are provided to a driver circuit to generate the switching control signals at the outputs 142 in a given switching cycle. In one example, the control circuitry 140 generates the pulse width modulated switching control signals SC1, SC2, SC3 and SC4 in each of a series of consecutive switching cycles.

In one example, the control circuitry 140 implements a generally constant switching frequency control implementation in which each consecutive switching cycle has a constant duration, although not a strict requirement of all possible implementations. In the illustrated three-level converter example, each switching cycle includes a respective set of four intervals, because: each switching cycle is divided into respective first and second sub-cycles; and each sub-cycle is divided into respective first and second control intervals. In this example, the control circuitry 140 generates the pulse width modulated switching control signals SC1, SC2, SC3 and SC4 to define switching states of the switching circuit for each interval. The ramp generator circuit 148 has an output 149 that is configured to provide one or more ramp signals (labeled RAMP in FIG. 1) to the PWM circuit 144 to control the first and second sub-cycle durations TSC1 and TSC2 in the given switching cycle. In one implementation, the ramp generator circuit 148 provides first and second ramp signals at the output 149.

The example IC 101 also includes a power circuit 150. In the illustrated example, the converter circuit 102, the control circuitry 140, and the power circuit 150 provided in a single integrated circuit 101. The power circuit 150 provides power to the control circuitry 140. In particular, the example power circuit 150 provides a DC supply voltage signal VDD to the control circuitry 140. In one example, the control circuitry 140 uses the supply voltage signal VDD to power driver circuitry of the PWM circuit 144 to generate the switching control signals SC1-SC4. The control circuitry 140 in one example also uses the supply voltage signal VDD to power the comparators and other circuits of the PWM circuit 144, as well as the output control circuit 146 and the ramp generator circuit 148.

The example power circuit 150 regulates power from the flying capacitor 120 to provide the regulated supply voltage signal VDD. The power circuit 150 includes a regulator with a regulator input 158 that receives a regulator input voltage signal VRI. The power circuit 150 includes a regulator output 164 that is coupled to the control circuitry 140 to provide the supply voltage signal VDD. The power circuit 150 further includes a power switching circuit coupled with the capacitor 120 and the switching circuit. The example power switching circuit includes a first power switch 151 and a second power switch 152 that selectively control the connection of the regulator input 158 to receive power from the flying capacitor 120. Any suitable first and second power switches 151 and 152 can be used, for example, MOSFET transistors.

The illustrated example includes a third power switch 153, configured as a single pole-double throw switch, although not required in all possible implementations. The third power switch 153, where used, can be implemented using MOSFET transistors or other switch types. In this example, the power circuit 150 includes a comparator 170 with an output 172 that provides a control signal to operate the third power switch 153. The comparator 170 includes a first input (+) connected to receive a supply reference voltage signal VDDR, and a second input (−) that is connected to receive an auxiliary node voltage signal VAUX from an auxiliary node 168.

In operation, the first power switch 151 of the power switching circuit selectively turns on to couple the regulator input 158 to the first internal node 122 in response to the second internal node 124 being coupled to the reference voltage node 108 in a given switching cycle. In one example, the first power switch 151 operates according to a first control signal DOB that is active when the second switching control signal SC2 turns the second converter switch 114 (Q2) on. In this example, the power switching circuit couples the regulator input 158 to the first internal node 122 when the second switch 114 is turned on. The second power switch 152 selectively turns on to couple the regulator input 158 to the second internal node 124 in response to the first internal node 122 being coupled to the input node 106. In this example, the second power switch 152 operates according to a second control signal DO that is active when the first switching control signal SC1 turns the first converter switch 112 (Q1) on.

The power switching circuit in this example couples the regulator input 158 to the second internal node 124 when the first switch 112 is turned on. The regulator circuit in one example is a low dropout (LDO) regulator circuit, with a PMOS transistor 156 and a transconductance amplifier (GMA) 160. The source of the transistor 156 is connected to the auxiliary node 168, the transistor drain is connected to provide the supply voltage signal VDD to the regulator output 164, and an output of the amplifier 160 is connected to the gate of the transistor 156. An inverting input 162 of the amplifier 160 is connected to receive a supply reference voltage signal VDDR. The non-inverting amplifier input is connected to the regulator output 164 to provide a feedback loop. The amplifier regulates the supply voltage signal VDD to the supply reference voltage signal VDDR. A capacitor 166 is connected between the regulator output 164 and the reference voltage node 108 to stabilize the supply voltage signal VDD.

In one possible implementation, the PWM circuit 144 includes an output 141 that provides the control signal DO to the power circuit 150, and an output 143 that provides the control signal DOB to the power circuit 150. In this example, the PWM circuit 144 generates the signals DO and SC2 concurrently, and generates the signals DOB and SC1 concurrently, so that the first power switch 151 turns on and off in accordance with the second switch 114 of the converter circuit 102, and the second power switch 152 turns on and off in accordance with the first switch 112 of the converter circuit 102. In certain implementations, for example, where the signal levels necessary to actuate the converter switches 112 and 114 are the same as the signal levels necessary to actuate the switches 151 and 152, the power switches 151 and 152 can be operated responsive to the switching control signals SC2 and SC1, respectively.

In the example of FIG. 1, the first power switch 151 includes a first terminal connected to the auxiliary node 168, and a second terminal connected to the first internal node 122. The second power switch 151 includes a first terminal connected to the auxiliary node 168, and a second terminal connected to the second internal node 124. The selective connection, in half of each given switching cycle, of the auxiliary node 168 to the voltage VTOP of the first internal node 122 (the top or first terminal of the flying capacitor 120) provides the voltage VAUX at the auxiliary node 168 relative to the reference voltage node 108. In the other half of the given switching cycle, the power switching circuit connects the auxiliary node 168 to the voltage VBOT of the second internal node 124 (the bottom or second terminal of the flying capacitor 120) to provide the voltage VAUX at the auxiliary node 168 relative to the reference voltage node 108.

Depending upon the switching states provided by the control circuitry 140 and the converter switching control signals SC1-SC4 during switching operation of the converter 102, the voltage VFLY of the flying capacitor 120 is floating with respect to the reference voltage node 108, referenced to the reference voltage node 108, or referenced to the input node 106. Where the flying capacitor voltage VFLY is equal to VIN/2, the controlled switching of the power switches 151 and 152 together with the converter switches SC2 and SC1, respectively, provides the auxiliary voltage signal VAUX at the auxiliary node 168 with an amplitude of approximately VIN/2. In this condition, the regulator operates with a regulator input voltage signal VRI of VIN/2. In one illustrative example, for an input voltage VIN of 12 V, and a supply voltage signal VDD of 5 V, the regulator receives a 6 V input and regulates this to provide the 5 V supply voltage signal VDD. For this example, the step-down amount of the regulator configuration is 1 V. This is in contrast to instead connecting the regulator input node 158 directly to the input node 106, in which case the step-down amount would be 7 V for this example. Accordingly, the power circuit 150 advantageously derives or harvests gate driver and other control circuit power by regulating the supply voltage signal VDD according to (e.g., in response to, or based upon) the voltage signal VFLY across the flying capacitor 120. The power circuit 150 improves efficiency of the power conversion system 100 and the IC 101.

Figure 2:
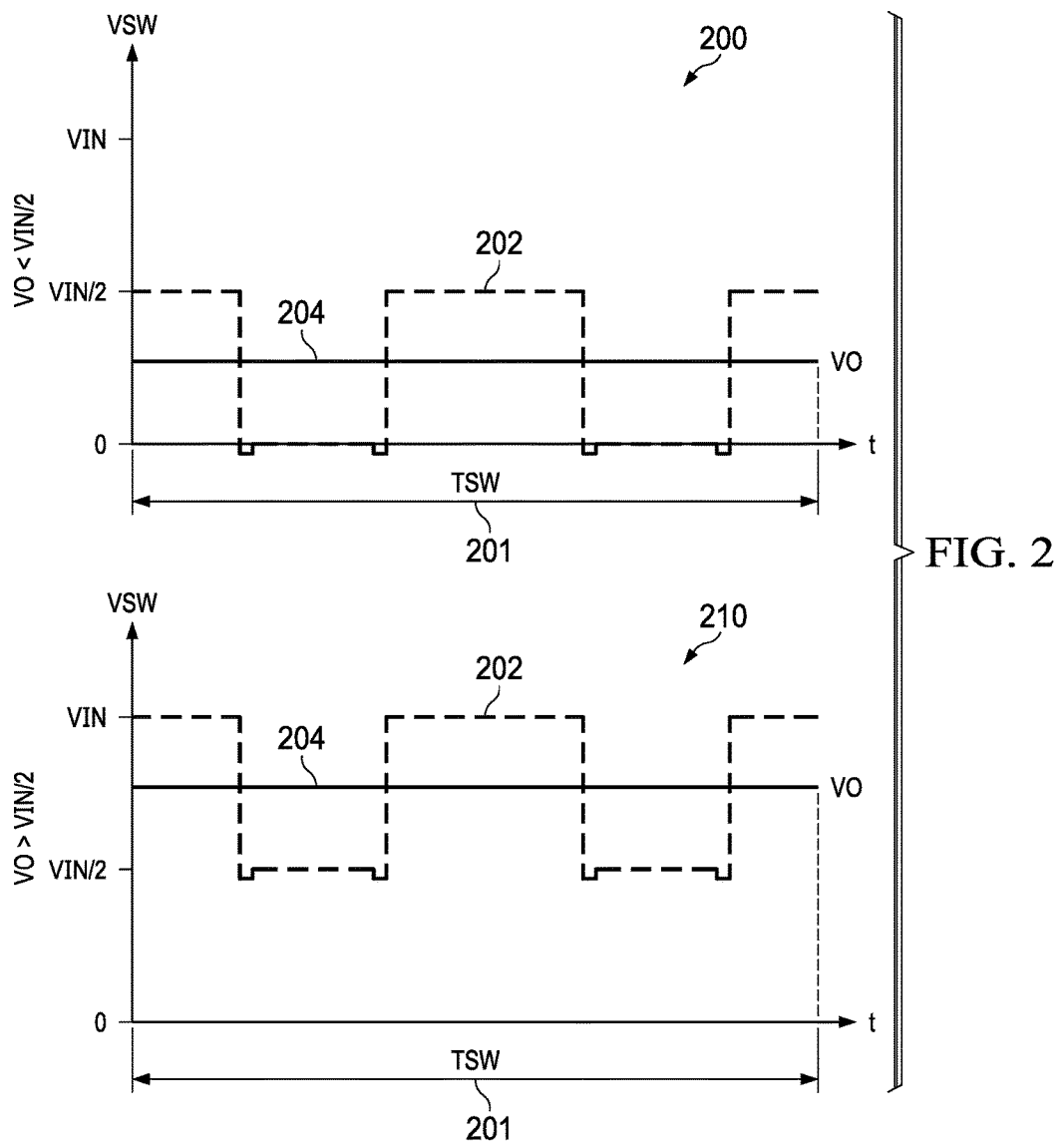
FIG. 2 shows graphs of switching node voltage for different levels of output voltage.

FIG. 2 shows graphs 200 and 210 of switching node voltage VSW for two different example levels of the output voltage signal. The graphs 200 and 210 illustrate two example steady state operating conditions in the system 100 of FIG. 1 when the control circuitry 140 regulates the switching control duty cycle to drive the voltage output signal VO to a level corresponding to the reference signal REF. The waveforms illustrated in FIG. 2 correspond to a three-level converter implementation. Different signal waveforms and switching states (not shown) can be used for other multi-level converter systems of higher orders (e.g., 4-level converters and above). The graph 200 shows a switching node voltage curve 202 (labeled VO) during an example switching cycle 201 with a total cycle period or duration TSW. The graph 200 shows two transitions of the switch node voltage signal VSW between approximately zero and VIN/2 in the four intervals of the example switching cycle 201 for an output voltage signal VO (curve 204) that is less than VIN/2. The graph 210 in FIG. 2 shows the switch node voltage and output voltage curves 202 and 204 for an example output voltage level above VIN/2. In this condition, the switch node voltage transitions twice between approximately VIN and VIN/2 in the example switching cycle 201. In one example, the control circuitry 140 provides the switching control signals SC1, SC2, SC3 and SC4, so that the switching cycles 201 have equal switching cycle durations TSW. In other implementations, the control circuitry 140 can vary the switching cycle durations TSW of successive switching cycles 201.

Figure 3:
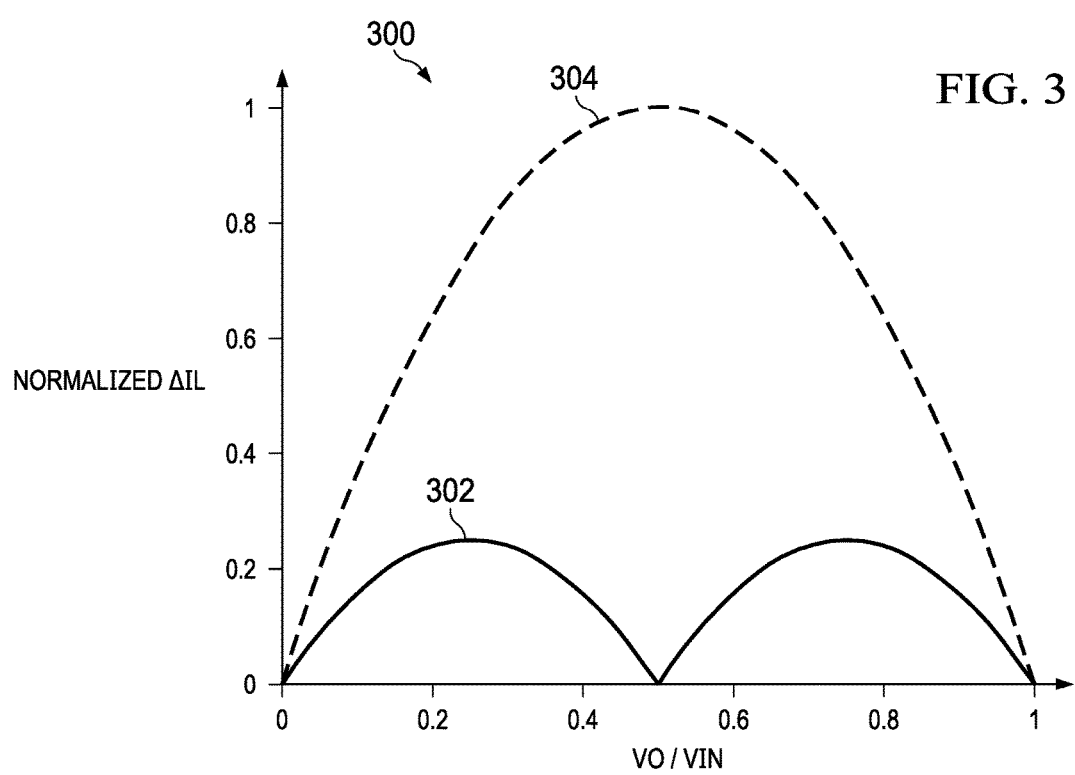
FIG. 3 is a graph of normalized inductor current change as a function of output voltage to input voltage ratio for a two-level buck converter and a three-level converter.

FIG. 3 shows a graph 300 with curves 302 and 304 of normalized inductor current ripple (labeled NORMALIZED ΔIL) as a function of output voltage to input voltage ratio VO/VIN. The curve 304 shows the normalized inductor current change for a two-level buck converter (not shown) and the curve 302 shows the normalized inductor current ripple for the example three-level converter in the system 100 of FIG. 1 for the same switching cycle duration. The three-level switch node toggles at twice the switching frequency compared to a single toggle for a two-level converter. In this manner, the inductor current ripple amount is reduced for the three-level converter implementation. The effective switching frequency doubles for the three-level converter (curve 302) compared with the two-level buck converter (curve 304). Also, the three-level converter (e.g., system 100 in FIG. 1) reduces the switching node voltage VSW by a factor of 2 compared with two-level buck converters. These two factors reduce the inductor current ripple by a factor of 4, allowing reduced switch transistor sizes and increased power density. Also, the described control circuitry 140 facilitates flying capacitor voltage control without disturbance of outer-loop regulation of the output signal VO. Described example multi-level converters facilitate output signal control in combination with the increased power density and other advantages of three or higher level power conversion systems.

Figure 4:
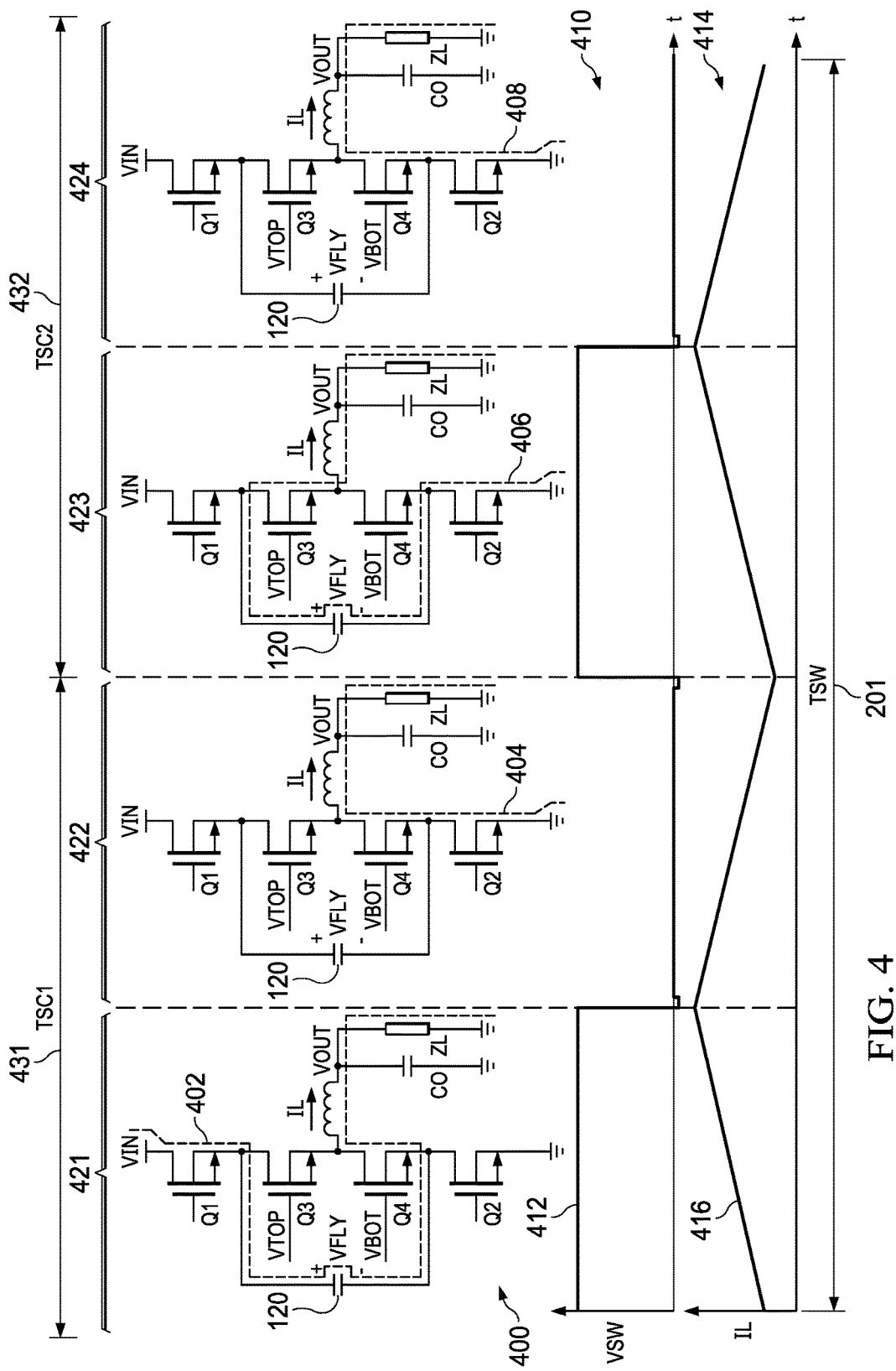
FIG. 4 is a graph of switch node voltage and inductor current in an example switching cycle in the power conversion system of FIG. 1.

FIG. 4 shows schematic representations 400 of the switching states of the converter circuit 102 in four example intervals of an example switching cycle 201 in the conversion system 100. The example switching cycle includes a first switching state in which the control circuitry 140 turns Q1 and Q4 on, and turns Q2 and Q3 off. In this switching state, current flows along a path 402 from the input node 106 through Q1, the flying capacitor 120, Q4 and the output inductor 126 and the flying capacitor 120 is charged. In the second switching state of FIG. 4, the control circuitry 140 turns Q1 and Q3 off, and turns Q2 and Q4 on. This causes current flow along a path 404 from the reference voltage node through Q2, Q4 and the output inductor. In a third switching state, the control circuitry 140 turns Q2 and Q3 on, and turns Q1 and Q4 off. This switching state discharges the flying capacitor 120 with current flow along a path 406. In a fourth example switching state in FIG. 4, the control circuitry 140 again turns Q1 and Q3 off, and turns Q2 and Q4 on to conduct current along a path 408. In this example, an on-time mismatch in the on time of the first and third switching states can cause accumulated offsets in the flying capacitor voltage VFLY as shown in the example of FIG. 4 over successive switching cycles 201.

FIG. 4 also includes a graph 410 with a curve 412 that shows the switching node voltage signal VSW during the example switching cycle 201. Also, a graph 414 in FIG. 4 includes a curve 416 that shows the inductor current signal IL during the example switching cycle 201. As shown in FIG. 4, the switching cycle 201 includes a first sub-cycle 431 with a first sub-cycle duration TSC1 and a second sub-cycle 432 with a second sub-cycle duration TSC2. The first sub-cycle 431 includes a first interval 421 that corresponds to the first converter circuit switching state (current conduction path 402), and a second interval 422 that corresponds to the second converter circuit switching state (current conduction path 404). The second sub-cycle 432 includes a third switching cycle interval 423 that corresponds to the third switching state (current conduction path 406), and a fourth switching cycle interval 424 that corresponds to the fourth switching state (current conduction path 408).

Figure 5:
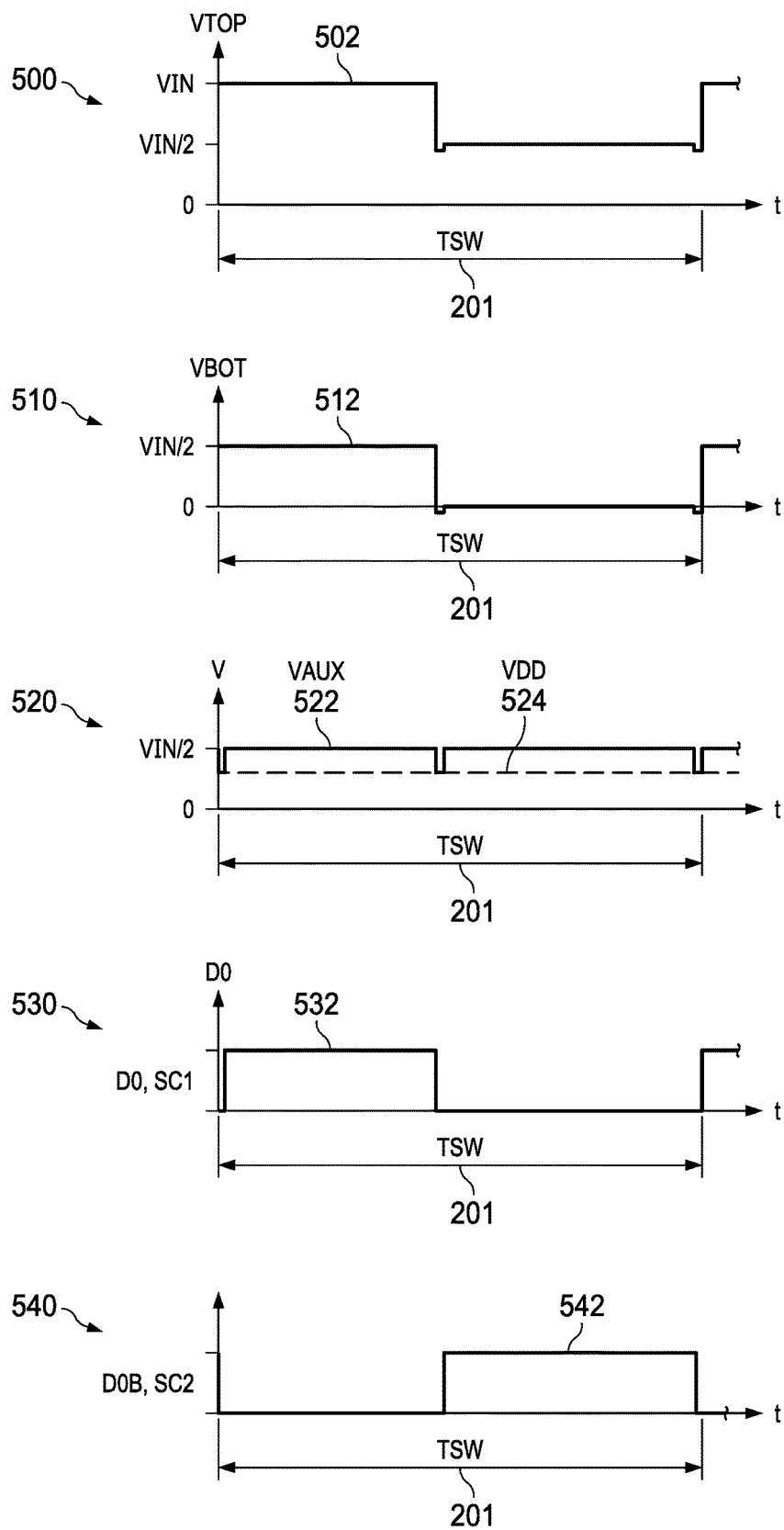
FIG. 5 is a signal diagram of voltage signals in the power circuit of FIG. 1.

FIG. 5 shows graphs 500, 510, 520, 530 and 540, including voltage signals in the power circuit 150 of FIG. 1 for an example switching cycle 201 of the conversion system 100. The graph 500 shows a curve 502 representing the voltage signal VTOP of the first internal node 122 relative to the reference voltage node 108 in FIG. 1. The graph 510 includes a curve 512 that shows the voltage signal VBOT at the second internal node 124 relative to the reference voltage node 108. The graph 520 includes a first curve 522 that shows the voltage signal VAUX at the auxiliary node 168, and a second curve 524 that shows the regulated supply voltage signal VDD. The graph 530 illustrates an example switching control signal curve 532 that corresponds to the first converter switching control signal SC1 and the power switch control signal DO in one example. The graph 540 shows an example switching control signal curve 542 that corresponds to the second converter switching control signal SC2 and the power switch control signal DOB in the example of FIG. 1.

As seen in the graphs 500 and 510, one of the internal nodes 122 and 124 is at a voltage of approximately VIN/2 throughout most of the given switching cycle 201, apart from brief intervals during some switching state changes. In the first portion of the illustrated switching cycle 201, the second internal node voltage VBOT (curve 512) is approximately VIN-VFLY=VIN/2 relative to the reference voltage node 108 while the first converter switch 112 is turned on (e.g., while the curve 532 (SC1) is active high). In this first portion, the PWM circuit provides the DO control signal active high to turn the switch 152 on and connect the second internal node voltage signal VBOT to the regulator input 158. In the second portion of the switching cycle 201, the first internal node voltage VTOP is approximately VIN/2 while the second converter switch 114 is turned on (e.g., while the curve 542 (SC2) is active high). During this portion, the PWM circuit provides the DOB control signal active high to turn the switch 151 on. This connects the first internal node voltage signal VTOP to the regulator input 158. The curve 522 in FIG. 5 shows the auxiliary node voltage signal VAUX at the node 168, which remains at approximately VIN/2 apart from brief intervals during some switching state changes and the beginning and middle of the switching cycle 201.

Figure 6:
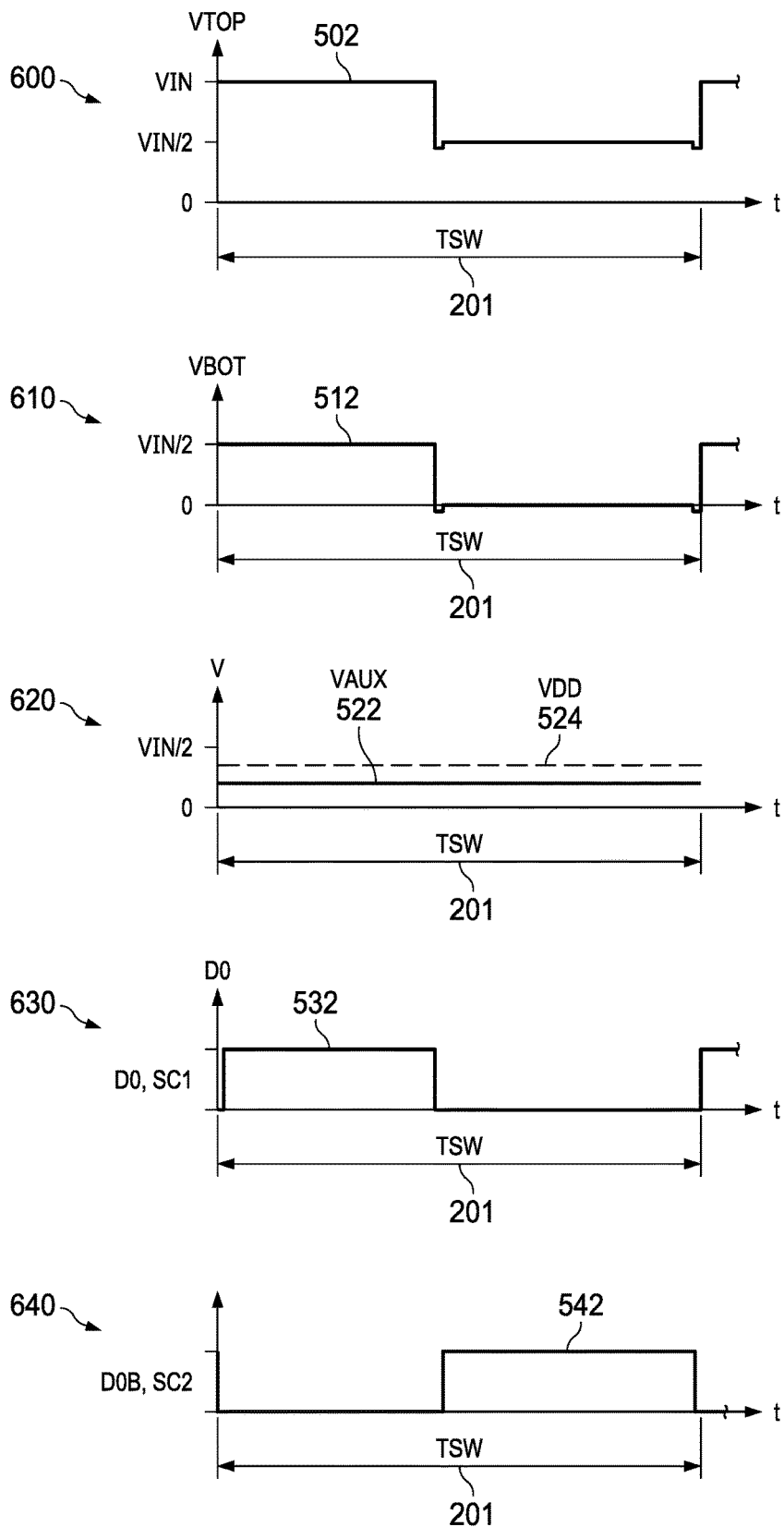
FIG. 6 is a signal diagram of voltage signals in another embodiment of the power circuit of FIG. 1.

Referring now to FIGS. 1 and 6, one example of the power switching circuit 150 includes the third power switch 153. The example third switch 153 is a single pole, double throw switch circuit, with a pole connected to the node 158. The switch 153 operates in a first state or a second state according to the control signal from the comparator output 172 to provide the regulator input signal VRI as either the auxiliary node voltage VAUX or the input voltage signal VIN. In this example, the power switching circuit 150 operates in a first state or a second state according to the relative levels of the auxiliary node voltage VAUX and the supply reference voltage signal VDDR. In response to VAUX being greater than VDDR, the comparator 170 operates the switch 153 in a first state to couple the regulator input 158 the auxiliary node 168 to receive a voltage signal VTOP or VBOT from one of the first and second internal nodes 122 or 124. In response to VAUX being less than or equal to VDDR, the comparator 170 operates the switch 153 in a second state to couple the regulator input 158 to the input node 106.

FIG. 6 shows graphs 600, 610, 620, 630 and 640, including voltage signals in the power circuit 150 of FIG. 1 for an example switching cycle 201 of the conversion system 100. In this case, the auxiliary node voltage VAUX is less than the supply reference voltage signal VDDR, and the comparator 170 sets the third power switch 153 in the second state to provide the input voltage signal VIN as the regulator input signal VRI. The graph 600 in FIG. 6 shows the VTOP curve 502 and the graph 610 shows the VBOT curve 512 as described hereinabove in connection with FIG. 5. The graph 620 includes the auxiliary node voltage VAUX curve 522, and the regulated supply voltage signal VDD curve 524. In this state, the regulator circuit continues to regulate the supply voltage signal VDD according to the supply reference voltage signal VDDR, and the switch 153 ensures sufficient headroom for the regulator, even though the auxiliary node voltage signal VAUX is less than the supply reference voltage signal VDDR. The graph 630 shows the switching control signal curve 532 (SC1 and DO), and the graph 640 shows the curve 542 (SC2 and DOB) as described hereinabove in connection with FIG. 5.

Further aspects of the described examples provide a method of controlling a multi-level power conversion system with a flying capacitor (e.g., system 100 in FIG. 1 hereinabove). The method includes generating pulse width modulated switching control signals (e.g., SC1, SC2, SC3 and SC4) with a controlled duty cycle in switching cycles 201 to operate switches (e.g., 112, 114, 116, 118) to convert an input signal VIN at an input node 106 to provide an output signal VO to an output node 104. The method further includes generating a regulator input voltage signal (e.g., VRI) from a selected terminal of the flying capacitor 120, and regulating the regulator input voltage signal VRI to provide a supply voltage signal (e.g., VDD) to control circuitry 140. In one example implementation, the method includes generating the regulator input voltage signal VRI from a first terminal (e.g., 122) of the flying capacitor 120 in response to the second flying capacitor terminal (e.g., 124) being coupled to the reference voltage node (e.g., 108) in a given switching cycle 20, and generating the regulator input voltage signal VRI from the second flying capacitor terminal 124 in response to the first flying capacitor terminal 122 being coupled to the input node (e.g., 106) in the given switching cycle 201. In one example, the method also includes generating the regulator input voltage signal VRI from the selected terminal (e.g., 122 or 124) of the flying capacitor 120 in response to the voltage VAUX of an auxiliary node 168 being greater than a supply reference voltage signal, and generating the regulator input voltage signal VRI from an input node 106 of the power conversion system 100 in response to the voltage VAUX being less than or equal to VDDR.

The described power circuits 150 and methods mitigate additional loss associated with stepping down the input voltage signal VIN to provide a regulated supply voltage signal VDD for use by the control circuitry 140. In the first operating mode when the auxiliary voltage signal VAUX is above the reference level VDDR, the circuit 150 utilizes the voltage stored in the flying capacitor for the regulator input for quasi-lossless step down to reduce power consumption and enhance efficiency and power density in the multi-level power conversion system 100. The example linear regulator supplied by the stepped-down auxiliary node voltage VAUX regulates the supply voltage signal VDD without significant voltage drop across the regulator transistor 156. The auxiliary step-down circuitry does not require an additional output capacitor and instead uses the flying capacitor of the multi-level architecture.

Modifications are possible in the described embodiments, and other embodiments are possible, within the scope of the claims.

What is claimed is:

1. A power conversion system comprising:
   an input node;
   an output node;
   a switching node adapted to be coupled through an inductor to the output node;
   a reference node;
   a converter circuit, including: a switching circuit having first and second nodes; and a capacitor coupled between the first and second nodes; the switching circuit including switches having respective switching inputs, the switches including a first switch coupled between the input node and the first node, a second switch coupled between the first node and the switching node, a third switch coupled between the switching node and the second node, and a fourth switch coupled between the second node and the reference node, the switches configured to control the switching node according to the switching inputs;

control circuitry having a power input, switching outputs, a first control output and a second control output, the switching outputs respectively coupled to the switching inputs, and the control circuitry configured to: generate pulse width modulated signals at the switching outputs; adjust a duty cycle of the pulse width modulated signals in different switching cycles; generate a first control signal at the first control output when the fourth switch couples the second node to the reference node; and generate a second control signal at the second control output when the first switch couples the first node to the input node; and a power circuit including:
a regulator having: a regulator input; and a regulator output coupled to the power input; and
a power switching circuit, including: a first power switch coupled between the regulator input and the first node, the first power switch configured to couple the regulator input to the first node responsive to the first control signal; and a second power switch coupled between the regulator input and the second node, the second power switch configured to couple the regulator input to the second node responsive to the second control signal.

2. The power conversion system of claim 1, further comprising an auxiliary node, wherein:
the first power switch includes a first terminal connected to the auxiliary node, and a second terminal connected to the first node;
the second power switch includes a first terminal connected to the auxiliary node, and a second terminal connected to the second node; and
the power switching circuit further includes a third power switch coupled between the auxiliary node and the regulator input, and coupled between the input node and the regulator input, the third power switch configured to connect the regulator input to either the auxiliary node or the input node responsive to whether a voltage at the auxiliary node is greater than a supply voltage.

3. The power conversion system of claim 2, wherein the regulator is a low dropout regulator circuit.

4. The power conversion system of claim 1, wherein the regulator is a low dropout regulator circuit.

5. The power conversion system of claim 1, wherein the converter circuit, the control circuitry, and the power circuit are formed as a single integrated circuit.

6. The power conversion system of claim 1, wherein the converter circuit is an N-level converter, and N is an integer greater than 2.

7. A power conversion system, comprising:
an input node;
an output node;
a switching node adapted to be coupled through an inductor to the output node;
a reference node;
an auxiliary node;
a converter circuit, including: a switching circuit having first and second nodes; and a capacitor coupled between the first and second nodes; the switching circuit including switches having respective switching inputs, the switches including a first switch coupled between the input node and the first node, a second switch coupled between the first node and the switching node, a third switch coupled between the switching node and the second node, and a fourth switch coupled between the second node and the reference node, the switches configured to control the switching node according to the switching inputs;

control circuitry having a power input and switching outputs, the switching outputs respectively coupled to the switching inputs, and the control circuitry configured to: generate pulse width modulated signals at the switching outputs; and adjust a duty cycle of the pulse width modulated signals in different switching cycles; and a power circuit including:
a regulator having: a regulator input; and a regulator output coupled to the power input; and
a power switching circuit, including:
a first power switch having a first terminal coupled to the auxiliary node, and a second terminal coupled to the first node, the first power switch configured to couple the auxiliary node to the first node when the fourth switch couples the second node to the reference node;
a second power switch having a first terminal coupled to the auxiliary node, and a second terminal coupled to the second node, the second power switch configured to couple the auxiliary node to the second node when the first switch couples the first node to the input node; and
a third power switch coupled between the auxiliary node and the regulator input, and coupled between the input node and the regulator input, the third power switch configured to couple the regulator input to either the auxiliary node or the input node responsive to whether a voltage at the auxiliary node is greater than a supply voltage.

8. The power conversion system of claim 7, wherein the regulator is a low dropout regulator circuit.

9. The power conversion system of claim 7, wherein the converter circuit, the control circuitry, and the power circuit are formed as a single integrated circuit.

10. The power conversion system of claim 7, wherein the converter circuit is an N-level converter, and N is an integer greater than 2.

11. A power circuit, comprising:
an input node;
an auxiliary node;
a regulator having: a regulator input; and a regulator output adapted to be coupled to a power input of a power conversion system; and
a power switching circuit, including:
a first power switch having a first terminal coupled to the auxiliary node, and a second terminal adapted to be coupled to a first capacitor terminal of a flying capacitor of the power conversion system, the first power switch configured to couple the auxiliary node to the first capacitor terminal when a second capacitor terminal of the flying capacitor is coupled to a reference node;
a second power switch having a first terminal coupled to the auxiliary node, and a second terminal adapted to be coupled to the second capacitor terminal, the second power switch configured to couple the auxiliary node to the second capacitor terminal when the first capacitor terminal is coupled to the input node; and a third power switch coupled between the auxiliary node and the regulator input, and coupled between the input node and the regulator input, the third power switch configured to couple the regulator input to either the auxiliary node or the input node responsive to whether a voltage at the auxiliary node is greater than a supply voltage.

12. The power circuit of claim 11, wherein:
the power switching circuit includes first and second control inputs adapted to be coupled to first and second control outputs of the power conversion system, respectively;
the first power switch is configured to couple the auxiliary node to the first capacitor terminal when a signal at the first control input indicates the second capacitor terminal is coupled to the reference node; and
the second power switch is configured to couple the auxiliary node to the second capacitor terminal when a signal at the second control input indicates the first capacitor terminal is coupled to the input node.

13. The power circuit of claim 12, wherein the regulator is a low dropout regulator circuit.

14. The power circuit of claim 11, wherein the regulator is a low dropout regulator circuit.

15. A method of controlling a multi-level power conversion system with a flying capacitor, the method comprising:

generating pulse width modulated signals having a duty cycle to operate switches to convert an input signal at an input node into an output signal at an output node, the duty cycle being adjustable in different switching cycles;

in response to whether a voltage at an auxiliary node of the power conversion system is greater than a supply voltage generating a regulator input voltage signal from either: a selected terminal of the flying capacitor; or an input node of the power conversion system; and regulating the regulator input voltage signal to provide a supply voltage signal to control circuitry of the power conversion system.

16. The method of claim 15, further comprising
generating the regulator input voltage signal from a first terminal of the flying capacitor in response to a second terminal of the flying capacitor being coupled to a reference node in a switching cycle of the power conversion system; and
generating the regulator input voltage signal from the second terminal of the flying capacitor in response to the first terminal of the flying capacitor being coupled to an input node of the power conversion system in the switching cycle.

* * * * *